United States Patent
Stich et al.

(10) Patent No.: US 11,681,002 B2
(45) Date of Patent: Jun. 20, 2023

(54) METHOD FOR RECORDING A MAGNETIC RESONANCE IMAGE DATA SET, DATA CARRIER, COMPUTER-PROGRAM PRODUCT, AND MAGNETIC RESONANCE SYSTEM

(71) Applicant: Siemens Healthcare GmbH, Erlangen (DE)

(72) Inventors: Manuel Stich, Parkstein (DE); Herbert Köstler, Retzbach (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/393,996

(22) Filed: Aug. 4, 2021

(65) Prior Publication Data
US 2022/0043090 A1    Feb. 10, 2022

(30) Foreign Application Priority Data
Aug. 4, 2020  (DE) ................. 10 2020 209 786.0

(51) Int. Cl.
*G01V 3/00*   (2006.01)
*G01R 33/565*   (2006.01)
(Continued)

(52) U.S. Cl.
CPC ... *G01R 33/56563* (2013.01); *G01R 33/4835* (2013.01); *G01R 33/543* (2013.01)

(58) Field of Classification Search
CPC ............ G01R 33/3415; G01R 33/543; G01R 33/5659; G01R 33/36; A61B 5/055
(Continued)

(56) References Cited

U.S. PATENT DOCUMENTS 6,160,397 A * 12/2000 Washburn ........ G01R 33/56554
                                                             324/309
2017/0089996 A1 * 3/2017 Feiweier ............... G01R 33/583
2018/0329010 A1   11/2018 Kluge et al.

FOREIGN PATENT DOCUMENTS

CN        108272452 A  *  7/2018
DE     102017207904 A1     11/2018
(Continued)

OTHER PUBLICATIONS

Aigner, Christoph S., et al. "Time optimal control-based RF pulse design under gradient imperfections." Magnetic resonance in medicine 83.2 (2020): 561-574.
(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A method for recording a magnetic resonance image data set includes providing a magnetic resonance sequence. The magnetic resonance sequence includes at least one radio-frequency pulse and a slice-selection gradient pulse applied during or before the radio-frequency pulse, which is configured as non-constant. The method includes providing at least one correction term for compensating a magnetic field change of the slice-selection gradient pulse. The magnetic field change is ascertained via a transfer characteristic of the gradient system of the magnetic resonance system. The method also includes recording at least one magnetic resonance image data set with the magnetic resonance sequence using the correction term.

17 Claims, 7 Drawing Sheets

(51) Int. Cl.
    *G01R 33/483* (2006.01)
    *G01R 33/54* (2006.01)
(58) Field of Classification Search
    USPC .......................................................... 324/309
    See application file for complete search history.

(56) References Cited

FOREIGN PATENT DOCUMENTS

| JP | 2011123052 A | * | 6/2011 | ........... G01R 33/385 |
|----|---|---|---|---|
| JP | 2016111788 A | * | 6/2016 | |
| WO | WO-2010018533 A2 | * | 2/2010 | ............ H03M 3/412 |

OTHER PUBLICATIONS

Campbell-Washburn, Adrienne E., et al. "Real-time distortion correction of spiral and echo planar images using the gradient system impulse response function." Magnetic resonance in medicine 75.6 (2016): 2278-2285.

Duyn, Jeff H. et al. "Simple Correction Method for k-Space Trajectory Deviations in MRI" Journal of Magnetic Resonance, vol. 132, Issue 1, May 1998, pp. 150-153.

German Office Action for German Application No. 10 2020 209 786.0 dated Apr. 26, 2021.

Han, Paul Kyu, et al. "A minimum-phase Shinnar-Le Roux spectral-spatial excitation RF pulse for simultaneous water and lipid suppression in 1H-MRSI of body extremities." Magnetic resonance imaging 45 (2018): 18-25.

Handbook of MRI Pulse Sequences; M.A. Bernstein, et al., book review, NMR in Biomedicine NMR Biomed. 2005; 18: 202-203.

Hargreaves, Brian A., et al. "Variable-rate selective excitation for rapid MRI sequences." Magnetic Resonance in Medicine: An Official Journal of the International Society for Magnetic Resonance in Medicine 52.3 (2004): 590-597.

Meyer, Craig H., et al. "Simultaneous spatial and spectral selective excitation." Magnetic resonance in medicine 15.2 (1990): 287-304.

Stich, Manuel, et al. "Gradient waveform pre-emphasis based on the gradient system transfer function." Magnetic resonance in medicine 80.4 (2018): 1521-1532.

Stich, Manuel: "Compatibility in Medical Imaging:"; 2019; DOI: https://doi.org/10.25972/0PUS-20347; English summary see p. 170.

Vannesjo, S. Johanna, et al. "Image reconstruction using a gradient impulse response model for trajectory prediction." Magnetic resonance in medicine 76.1 (2016): 45-58.

Vannesjo, Signe J., et al. "Gradient system characterization by impulse response measurements with a dynamic field camera." Magnetic resonance in medicine 69.2 (2013): 583-593.

* cited by examiner

METHOD FOR RECORDING A MAGNETIC RESONANCE IMAGE DATA SET, DATA CARRIER, COMPUTER-PROGRAM PRODUCT, AND MAGNETIC RESONANCE SYSTEM

This application claims the benefit of German Patent Application Number 10 2020 209 786.0, filed on Aug. 4, 2020, which is hereby incorporated by reference in its entirety.

BACKGROUND

The present embodiments relate to a method for recording a magnetic resonance image data set with a magnetic resonance system having a gradient system, and further relates to a data carrier, a computer-program product, and a magnetic resonance system.

Two different magnetic fields are used to perform magnetic resonance scans. A basic magnetic field $B_0$ is used to obtain excess magnetization. This may be swung out of the rest position with a radio-frequency pulse $B_1$.

Further, magnetic field gradients G enable a selection of a desired slice and spatial encoding. A magnetic resonance system typically has three gradient coils that generate gradients in the x, y, and z directions. Herein, the z direction is by definition the direction of the basic magnetic field $B_0$; the x axis, y axis, and z axis are perpendicular to one another. The x axis, y axis, and z axis define gradients that may be physically implemented by a single gradient coil.

In the present application, gradients in the direction of the imaging axes are referred to as imaging gradients. Herein, there is usually a read direction, a phase-encoding direction, and a slice selection direction. These are also perpendicular to one another and arbitrary with respect to the x, y, and z axes. Herein, a gradient in the read direction that is not in the x, y, or z direction is formed by superimposition by two or three gradients that are physically present. The question as to whether the read gradient, the phase-encoding gradient, and the slice-selection gradient are formed by a single one of the gradients that are physically present or by superimposition depends on the position of the read direction, the phase-encoding direction, and the slice selection direction compared to the x, y, and z direction.

Single gradient switching from a start value to one or more target values and possibly back to the start value (e.g., zero) is also referred to as a gradient pulse. Herein, the gradient moment is the integral of the gradient strength of the gradient pulse over the time in which the gradient pulse is applied.

It is known in principle that the currents applied to the gradient coils for generating the gradients do not exactly generate the fields that the currents are supposed to. To compensate the effects of eddy currents, it is known, for example, to measure formation of the eddy currents in dependence on the nominal gradients that are actually desired in order to adapt the currents of the gradient coils such that the nominal gradient is applied at the end. For this purpose, the nominal gradient or the associated current is pre-distorted so that the pre-distorted gradient under the influence of the distortion of the eddy currents results in the nominal gradient overall. The nominal gradient may also be referred to as the setpoint gradient.

The values for the pre-distortion are stored in a characteristic map, which is referred to as the pre-distortion filter or also pre-emphasis. The values required in each case are taken from this in order to pre-distort the gradients or the generating currents.

To achieve optimal mapping of the anatomy of a patient, it is very common for the direction of the imaging gradients to be skewed with respect to the direction of the physical gradients. Two or three gradient coils are then used in order to generate an imaging gradient.

The deviation of the gradient actually played out from the nominal gradient may be described by a transfer characteristic of the gradient system, which may be determined for each magnetic resonance system. Assuming a linear and time-invariant system, a suitable transfer characteristic in the time domain is the gradient impulse response function (GIRF).

Consideration of the gradient impulse response function in the pre-distortion filter is also known (see, e.g., DE 10 2017 207 904 A1). A formula for calculating the gradient impulse response function may be found in Vannesjo et al.: Image Reconstruction Using a Gradient Impulse Response Model for Trajectory Prediction, Magnetic Resonance in Medicine 76:45-58 (2016).

In addition to the gradient impulse response function, the gradient system transfer function (GSTF) is also used. The gradient system transfer function GSTF lies in the frequency domain and is derived from the gradient impulse response function GIRF in the time domain by a Fourier transform $\mathscr{F}$:

$$\text{GSTF}(f) = \mathscr{F}\{\text{GIRF}(t)\}$$

The GSTF may also be used to pre-distort (e.g., pre-emphasize) the played-out gradients, as, for example, described in M. Stich, T. Wech, A. Slawig et al. "Gradient Waveform Pre-Emphasis Based on the Gradient System Transfer Function", Magnetic Resonance in Medicine 2018; 80: 1521-1532. In this paper, the GSTF of an MR-system was determined and used to predict the k-space trajectories, but also to correct the played-out gradients by a corresponding pre-emphasis.

SUMMARY AND DESCRIPTION

The scope of the present invention is defined solely by the appended claims and is not affected to any degree by the statements within this summary.

The correction methods based on the GSTF described to date each refer to the k-space trajectory of the imaging sequence. The problems with slice selection have not yet been addressed since, as a rule, constant gradient fields are used, and slight deviations in these fields do not have any dramatic effects on image quality.

On this basis, the present embodiments may obviate one or more of the drawbacks or limitations in the related art. For example, a method for recording a magnetic resonance data set with which slice selection is improved is provided.

A method with the following acts is provided. A magnetic resonance sequence for performing a magnetic resonance scan is provided. The magnetic resonance sequence has at least one radio-frequency pulse and a slice-selection gradient pulse applied during or before the radio-frequency pulse. At least for a predetermined time interval, the slice-selection gradient pulse is configured as non-constant during the application of the radio-frequency pulse. The method includes providing at least one correction term for compensating a magnetic field change of the slice-selection gradient pulse. The magnetic field change is obtained as a change to an actual magnetic field compared to a setpoint magnetic field due to the gradient pulse. The magnetic field change is ascertained via a transfer characteristic of the gradient system of the magnetic resonance system, and the transfer characteristic represents the system characteristic of the gradient system in amplitude and/or phase of different frequencies. The method includes recording at least one magnetic resonance image data set with the magnetic resonance sequence using the at least one correction term.

The present embodiments have recognized that a correction to the gradient pulses may not only be used on phase and readout gradients, but also has particular advantages with slice-selection gradients. In contrast to the readout gradients, which "only" lead to another k-space trajectory than that desired, so that these effects may also be corrected subsequently, errors in slice-selective gradients may not be corrected later. This is particularly serious in the case of slice-selection methods that require a non-constant slice-selection gradient pulse.

A correction term is, for example, a current feed rating or a change in current for one or more coils (e.g., one or more gradient coils or one or more shim coils). The current feed for the coil then results, for example, in a compensation field, which compensates the magnetic field change. The correction term may also directly indicate a corrected gradient pulse or a corresponding compensation field. According to another embodiment, the correction term is used to generate a compensation phase (e.g., indicates an unwanted phase shift or an unwanted change to the basic magnetic field).

According to one embodiment, the at least one correction term is used to generate a corrected slice-selection gradient pulse (e.g., the at least one correction term already contains a current feed rating for the gradient coils with which a corrected slice-selection gradient pulse may be generated). The at least one correction term may also include a current feed rating for an additional magnetic field generated, for example, by a shim coil current feed. For example, the slice-selection gradient pulse corrected according to the present embodiments is switched during, and optionally also before or after, the output of the slice-selection radio-frequency pulse (RF pulse). The slice-selection gradient pulse is configured such that the slice-selection gradient pulse is not time-constant but varies over time (e.g., matched to the RF pulse).

An example of such RF pulses with gradient switching matched thereto is, for example, variable-rate selective excitation (VERSE) pulses. VERSE pulses allow a low specific absorption rate (SAR). VERSE combines a time-varying gradient shape with a modified RF waveform in order to achieve a similar excitation profile as with a conventional slice-selection pulse with a different RF power and duration. Thus, VERSE pulses require a more complicated RF pulse/gradient design algorithm than is the case with constant slice-selection gradients. Hence, for this reason, imperfections in the system, such as the aforementioned gradient imperfections, have a more serious negative influence than on other "standard" slice-selective RF pulses/gradients.

In addition, the present embodiments may also be applied to multidimensional pulses, such as spectral-spatial or multidimensional-spatial pulses. Spectral-spatial pulses use a non-constant encoding gradient in one spatial dimension, and multidimensional pulses use two or more spatial encoding gradients, such as, for example, described in M. A. Bernstein, K. F. King and X. J. Zhou, "Handbook of MRI Pulse Sequences", Elsevier Academic Press 2004; see also C. H. Meyer, J. M. Pauli et al. "Simultaneous Spatial and Spectral Selective Excitation" Magnetic Resonance in Medicine 1990, 15: 287-304. Hence, gradient imperfections in the case of multidimensional excitations may lead to errors in both spectral and spatial excitation that cannot be corrected later. A further example of a pulse with non-constant gradients is presented in Paul J. Han "A minimum-phase Shinnar-Le Roux spectral-spatial excitation RF pulse for simultaneous water and lipid suppression in 1H-MRSI of body extremities," Magnetic Resonance Imaging, [0730-725x], 45: 18-25 (2018).

The present embodiments are therefore, for example, directed at correcting the gradient shape of such gradient pulses with a gradient characteristic, such as, for example, the GSTF of a gradient system. The Fourier transform (GIRF) may also be used as an alternative to GSTF as a pre-emphasis technique in order to provide that the nominal gradient is played out.

In one embodiment, the transfer function GSTF may be used as the transfer characteristic. This may, for example, be determined as described in the aforementioned article by M. Stich. However, other transfer characteristics describing the behavior of the gradient system are also covered by the present embodiments (e.g., the actual fields generated in relation to the setpoint fields).

When gradient pulses are applied, there is a deviation of the gradient on not only the same gradient axis, but also on the other gradient axes. The first effect is the self-term, and the second effect relates to cross-terms. Further, there is an effect on the basic magnetic field $B_0$ and also on higher-order terms, such as quadratic terms or cubic terms. All of the effects mentioned lead to unwanted deviations of the actual magnetic field (e.g., of the played-out slice-selection gradient) from the setpoint magnetic field (e.g., the nominal gradient) and hence to image artifacts.

All the following magnetic field effects or magnetic field changes may be ascertained from the GIRF or GSTF: the effect of a gradient on the basic field $B_0$ (e.g., constant field, zero order), an effect of a gradient (e.g., linear gradient) on itself (e.g., self-term, 1st order), an effect of a gradient on the other two gradients (e.g., cross-terms, 1st order), and a higher order effect (e.g., quadratic, cubic (2nd order and above)).

A separate correction term may be determined for each of these deviations. The correction for the zero order may, as will be described later, take place in two ways (e.g., the reference phase of the magnetic resonance system may be corrected in order to correct the zero order).

In order to correct the slice-selection gradient pulses with the transfer function GSTF(f), the slice-selection gradient pulses are pre-distorted with the transfer function. In this way, ultimately, the nominal gradients $G_{nom,k}(t)$ are played out, where k stands for one of the axes x, y, or z. In the time domain, the pre-distortion may be described as follows:

$$G_{pre,k}(t) = \mathcal{F}^{-1}\{ \mathcal{F}\{G_{nom,k}(t)\}/\text{GSTF}_k^l(f)\}$$

Herein, l denotes the order of the transfer function of the gradient system of the magnetic resonance system, k denotes one of the gradient axes x, y, or z, $\mathcal{F}$ denotes a Fourier transform, $\mathcal{F}^{-1}$ denotes an inverse Fourier transform, and $G_{nom,k}$ denotes the nominal gradient or gradients desired on the gradient axis x, y, z. Therefore, the pre-distorted gradients $G_{pre,k}(t)$ are applied in order to obtain the nominal slice-selection gradient pulses $G_{nom,k}(t)$ for a given transfer function GSTF(f).

The transfer function GSTF may be present in the frequency domain and for each axis and orders l=0, 1, etc. The nominal gradient $G_{nom}$ may be specified in the time domain. Therefore, the nominal gradient $G_{nom}$ is to be Fourier-transformed in order also to be transferred into the frequency domain. The transformed nominal gradient $G_{nom}$ may then be divided by the transfer function GSTF(f). This quotient is inversely Fourier-transformed in order to achieve a transfer into the time domain.

The correction may extend to all gradient axes k=x, y, z or to only one or two relevant axes.

In detail, the correction may be performed as follows: In an earlier time domain (e.g., when the magnetic resonance system is installed and commissioned), the transfer characteristic of the gradient system (e.g., the gradient system transfer function (GSTF)) is ascertained once. This may be done using known methods (e.g., with a phantom and slice-selective pulses or a dynamic field camera, as described in the cited article by M. Stich). The determination of the GSTF may also be repeated at regular intervals (e.g., 1-5 times a year). The expected nominal gradient waveform of the slice-selection gradient pulse $g_{nom}(t)$ is convoluted with the inverse of the predetermined GSTF, as described by the above formula, resulting in a corrected gradient pulse with pre-emphasis ($g_{pre}$). If the gradient system is actuated with the corrected gradient pulse, due to the pre-emphasis, it is not the gradient waveform $g_{pre}$ that is played out, but the expected nominal gradient waveform $g_{nom}$.

The use of this kind of pre-emphasis based on a transfer characteristic of the gradient system such as the GSTF prevents gradient distortions that may lead to a discrepancy between the RF pulse that is played out simultaneously and the gradient, such as, for example, in the case of incorrect registration of k-space points in multidimensional excitations. Gradient correction has already been described for readout gradients, but not for the correction of slice-selective gradients during and before the application of radio-frequency pulses.

According to one embodiment, the corrected gradient pulse (e.g., the gradient pulse $G_{pre}$ provided with the pre-emphasis according to the present embodiments) is calculated by:

$$G_{pre,k}(t) = \mathcal{F}^{-1}\{\mathcal{F}\{G_{nom,k}(t)\}/\text{GSTF}_k^{l=1}(f)\}.$$

In other words, the correction takes account of the 1st order terms (e.g., the linear self-terms and cross-terms) of the GSTF.

According to some embodiments, higher or lower order terms (e.g., 2nd order and/or zero order terms are also taken into account).

In order to select a spatial area in the examination object, a slice-selection gradient pulse is applied at the same time as a radio-frequency pulse. A slice-selection gradient pulse usually also has components before and after the radio-frequency pulse (e.g., in the case of a slice-selection rephasing gradient).

According to the present embodiments, at least for a predetermined time interval, the slice-selection gradient pulse is embodied as non-constant. While a constant gradient in interaction with a radio-frequency pulse enables slice selection, a non-constant gradient enables a different selected volume or a faster selection to be obtained.

As described, the slice-selection gradient pulse is distorted compared to a nominal shape of the slice-selection gradient pulse by self-terms and/or cross-terms. Thus, the gradient moment generated is also distorted. Therefore, it is provided according to one embodiment that a compensation field for compensating this distortion or magnetic field change is applied in order to obtain the nominally desired gradient at each time point of the application of the slice-selection gradient pulse simultaneously with the radio-frequency pulse. Therefore, the gradient is pre-distorted in order to obtain the nominal strength, and hence also the nominal gradient moment, while taking account of the transfer characteristic. The compensation field or the corrected slice-selection gradient pulse is then added to the magnetic resonance sequence, and thus, the magnetic resonance data set is recorded.

Examples of imaging magnetic resonance sequences include gradient-echo (GE) scanning sequences or spin-echo (SE) scanning sequences that may be corrected according to the present embodiments. Examples of gradient-echo scanning sequences include fast low angle shot (FLASH), a fast imaging with steady precession (FISP) scanning sequence, or also a balanced steady-state free precession (bSSFP) scanning sequence. An example of a spin-echo scanning sequence is a turbo-spin-echo (TSE) scanning sequence.

The corrected gradient pulse may be obtained by correcting the gradient strength of the slice-selection gradient pulse, specifically with regard to deviations of the actual strength from the setpoint strength. Pre-distortion of the gradient profile causes the desired non-constant gradient strength to be obtained at each point in time.

The correction of the gradient pulse by pre-distortion of the gradient strengths may also be carried out for every other gradient pulse of the magnetic resonance sequence in addition to the slice-selection gradient pulse. In one embodiment, in addition to the slice-selection gradient pulse, it is also possible for a read gradient pulse and/or a phase gradient pulse and/or a phase-rewind gradient pulse and/or a read-dephasing gradient pulse and/or a read-rewind gradient pulse to be pre-distorted or corrected.

The compensation field may contain a part simultaneously with the gradient pulse to be corrected and additionally a part after the gradient pulse. For example, the self-terms and cross-terms contain different components, exponentially decreasing components, and oscillating exponentially decreasing components.

The slice-selection gradient pulse may be configured as at least temporarily non-constant during the application of the radio-frequency pulse. The slice-selection gradient pulse may be configured as non-constant during the entire duration of the application of the radio-frequency pulse. For example, the slice-selection gradient pulse fluctuates between a minimum value and a maximum value. With this shaping, k-space may be traversed during the application of the radio-frequency pulse. This enables the formation of multi-dimensional spatial selections, where at least two spatial dimensions are selected. In the case of slice selection with a constant gradient, the selection is only made in one spatial dimension. Further, herein, there may also be a simultaneous spectrally selective and spatially selective selection, where at least one spatial dimension is selected. In one embodiment, at least two spatial dimensions or one spectral and one spatial dimension are selected.

The slice-selection gradient pulse may be configured as sinusoidal during the application of the radio-frequency pulse, at least temporarily (e.g., during the entire duration). The fluctuations are then configured as constant in terms of time. This enables uniform k-space sampling.

In one embodiment, a transfer characteristic of the gradient system may be the transfer function GSTF or the gradient impulse response function GIRF. The transfer characteristic is to be either known or ascertained at the beginning of the method (e.g., by a measurement). Since a single measurement is sufficient and the measurement may take place when the magnetic resonance system is set up, it may be assumed that the transfer characteristic is held in a memory or a cloud. Herein, the transfer characteristic may also be saved in an accessible cloud; the transfer characteristic does not even have to be saved directly on the device memory.

The transfer characteristic of the gradient system may have orders, and the at least one correction term or the corrected slice-selection gradient pulse may be ascertained at least for the component of 1st order self-terms. Further, 1st order cross-terms may be taken into account during the ascertainment of the corrected gradient pulse.

According to one embodiment, the effect of switching the gradient pulses on the basic magnetic field may also be taken into account (e.g., zero order GSTF). A compensation phase or a basic compensation field may then be ascertained. Switching the gradient pulses may also lead to a magnetic field change $DB_0$ of the basic magnetic field $B_0$ (e.g., the "$B_0$-Hub").

The magnetic field change may be calculated as follows:

$$\Delta B_{k,l=0}(t) = \mathcal{F}^{-1}(\mathcal{F}\{G_{nom,k}(t)\} \cdot GSTF_{k,l}(f)).$$

where l denotes the zero order of the gradient system transfer function of the magnetic resonance system, k denotes one of the gradient axes (x, y, z), $\mathcal{F}$ denotes a Fourier transform, and $G_{nom,k}$ denotes the nominal gradient(s) applied to the gradient axis (x, y, z). The total change to the basic magnetic field for the zero order is the sum of the axis-wise deviations:

$$\Delta B = \Sigma_k \Delta B_k$$

If a single axis k, k=x or y or z turns out to be the main cause of the magnetic field change, even $\Delta B_{k=k,l=0}$ may be assumed. Thus, only the zero order and the axis k are taken into account.

Uncorrected, the magnetic field change $DB_0$ of the basic magnetic field $B_0$ leads to an unwanted phase change $Df$ to the magnetization. This disturbance may be compensated in two ways: the phase change may be prevented from occurring in the first place by applying a basic compensation field using a coil. This is opposed to the calculated magnetic field change to the basic magnetic field in order to compensate the calculated magnetic field change to the basic magnetic field. The basic compensation field is therefore a field with a constant field strength in space that is applied for a predetermined time domain. Herein, a shim coil, an additional coil, or the coil for generating the basic magnetic field $B_0$ may be used. The coil for generating the basic magnetic field is normally too inert to compensate short-term $B_0$ changes. Therefore, additional hardware is usually required.

Therefore, to avoid this hardware, it is simpler to allow the magnetic field change to the basic magnetic field. The resulting phase may be determined from the magnetic field change to the basic magnetic field:

$$Df = \int g \cdot DB \, dt.$$

This phase may, for example, be compensated by adapting the reference phase of the magnetic resonance system. Thus, a software-based solution is implemented. The reference phase may be adjusted at predetermined points in time (e.g., once within a sequence block or before each RF pulse). Quasi-continuous adaptation of the phase is also possible.

The corrected gradient pulse (or the at least one correction term) may be generated via a pre-distortion filter for the gradient system. The pre-distortion filter is, for example, a characteristic map. The relevant correction values are then selected automatically. In each case, the relevant characteristic curve is used in dependence on the gradient pulses used. As a result, the correction is automatically used in each magnetic resonance sequence that uses the pre-distortion filter. The shape of a gradient pulse is modified by the pre-distortion filter such that the nominal gradient is obtained taking into account at least the 1st order self-terms and, for example, also the $1^{st}$ order cross-terms of the GIRF-based deviations.

Alternatively, in addition to or instead of the pre-distortion filter, the compensation field or the corrected gradient pulse may be ascertained based on the selected magnetic resonance sequence and the parameters set there. As disclosed in DE 10 2017 207 904 A1, this may, for example, be done "on the fly". Then, instead of a characteristic map, software may also determine gradient correction terms using the saved transfer function. If part of the compensation field has already been specified by a pre-distortion filter, the optimization calculation may take place. The component that has already been implemented via the pre-distortion filter is then to be subtracted from the compensation field calculated for the present magnetic resonance sequence.

Even though the singular is always used when speaking of the slice-selection gradient pulse, as described above, it is possible for multiple or all gradient pulses of the magnetic resonance sequence to be corrected. Then, multiple corrected gradient pulses may be obtained via the pre-distortion filter and "on the fly".

In one embodiment, cross-terms may also be taken into account in the pre-distortion filter. For example, 1st order cross-terms may be taken into account.

The present embodiments further relate to a computer-program product that may be loaded into a memory of a programmable control facility or a computing unit of a magnetic resonance system. This computer-program product may be used to execute all or some of the above-described embodiments of the method according to the present embodiments when the computer-program product is running in the control facility. Herein, the computer-program product may require program means (e.g., libraries and auxiliary functions) in order to implement the corresponding embodiments of the method.

In other words, the computer-program product is, for example, intended to protect software with which one of the above-described embodiments of the method according to the present embodiments may be executed or which executes this embodiment. Herein, the software may be a source code (e.g., C++) that still has to be compiled and linked or only has to be interpreted, or an executable software code that only needs to be loaded into the corresponding computing unit or control facility for execution.

In addition, the present embodiments relate to a data carrier (e.g., a non-transitory computer-readable storage medium) for a control facility for controlling a computer (e.g., a data generating unit of a magnetic resonance system and/or an evaluation unit with data for carrying out the described method). In one embodiment, the data generating unit may be an image-generating unit. The evaluation unit may be a component of the magnetic resonance system or an external unit. The data carrier may then also be a permanently accessible memory of the magnetic resonance system. For this, the data carrier does not have to be built into the control facility of the magnetic resonance system; the data carrier may also be configured as a storage service or cloud server.

Herein, the aforementioned methods may be implemented in the control apparatus in the form of software or also in the form of hardware (e.g., hard-wired hardware).

In addition, the present embodiments relate to a magnetic resonance system with a gradient system and a control facility. The magnetic resonance system is characterized in that the control facility is configured to perform the method as described. The gradient system may include three gradient coils for generating three magnetic field gradients. The magnetic field gradients generated are perpendicular to one another.

Further embodiments of the magnetic resonance system correspond to corresponding embodiments of the method according to the present embodiments. Hence, to avoid unnecessary repetitions, reference is made to the corresponding method features and the advantages thereof.

DETAILED DESCRIPTION

Figure 1:
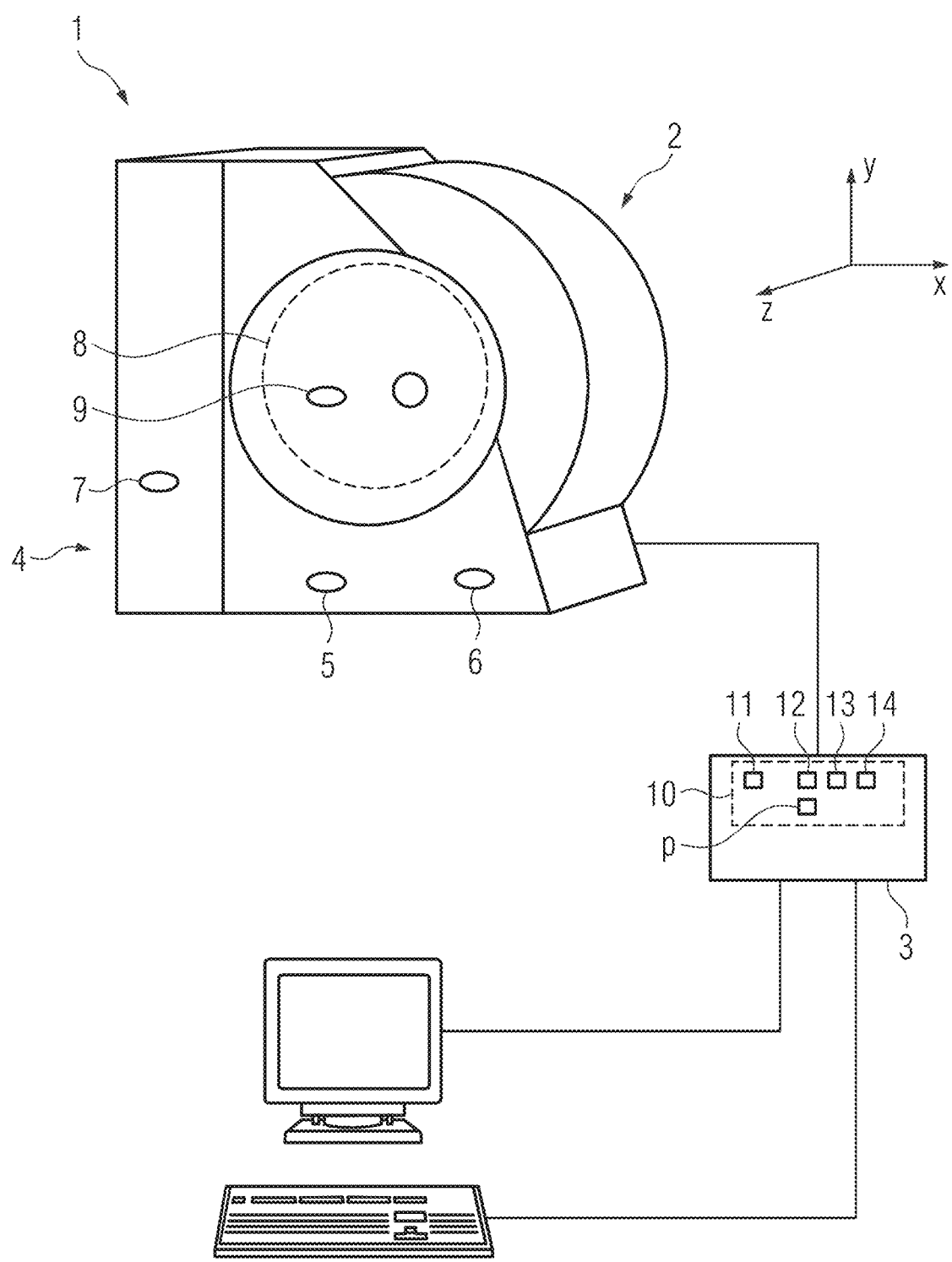
FIG. 1 shows one embodiment of a magnetic resonance system.

FIG. 1 shows one embodiment of a magnetic resonance system 1 with a scanner 2 and a control facility 3. The scanner 2 includes a gradient system 4 with three gradient coils 5, 6, and 7 for generating three gradient fields. The gradient fields that may be generated are aligned in the x, y, and z directions and are perpendicular to one another.

Further, a transmitting coil arrangement 8 and a receiving coil arrangement 9 are arranged on the scanner 2. The transmitting coil arrangement 8 may be configured as a whole-body coil. The receiving coil arrangement 9 may be configured as a coil array. The receiving coil arrangement 9 is used as a local coil.

In principle, however, the transmitting coil arrangement 8 may also be used to receive signals. However, the use of a receiving coil arrangement 9 not only increases the signal-noise ratio SNR per se, but the receiving coil arrangement 9 may also be used to perform parallel imaging. This may shorten the scan time.

The control facility 3 of the magnetic resonance system 1 has a data carrier 10 on which a computer-program product 11 for performing the described method is saved. A magnetic resonance sequence 12 and different two-dimensional or spectral-spatial selective pulses 13, 14 may be stored on the data carrier 10. In addition, at least one pre-distortion filter p may be saved on the data carrier.

Further, customary components of the magnetic resonance system 1, such as a patient couch, etc. are not shown for the sake of clarity.

Figure 2:
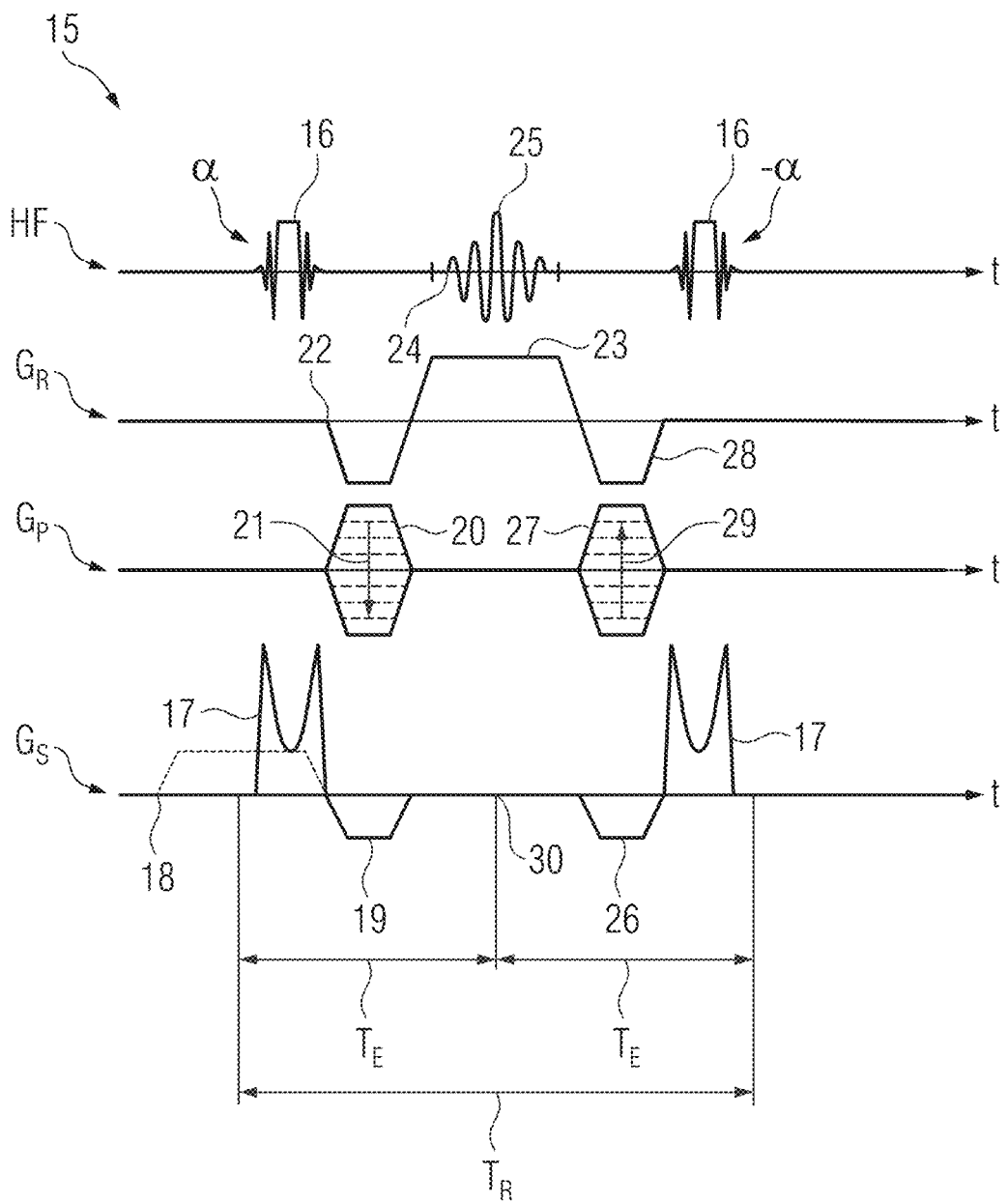
FIG. 2 is a bSSFP sequence diagram with exemplary Cartesian k-space sampling.

FIG. 2 shows a bSSFP sequence diagram 15 for the bSSFP scanning sequence 12 with a Cartesian sampling scheme. As usual, the imaging gradient axes are labeled $G_R$ for the read direction, $G_P$ for the phase-encoding direction, and $G_S$ for the slice selection direction. These may match the axes x, y, and z in FIG. 1, as described in the introduction but the imaging gradient axes do not have to.

Even if the axes match, herein, fixed assignment is not mandatory; therefore, the axis of the read direction may lie in the direction of the x, y, or z axis. The axis of the phase-encoding direction and the axis of the slice selection direction are distributed between the remaining axes from the group of the x axis, y axis, and z axis.

However, usually, the axes do not match. Then, the gradients in the directions $G_R$, $G_P$, and $G_S$ are formed by two or three of the gradient coils 5, 6, and 7 and thus of the gradients in the direction of the axes x, y, and z.

HF denotes the axis for the radio-frequency pulses and acquisition windows.

In order to excite only one slice with the radio-frequency pulses 16, a slice-selection gradient pulse 17 is applied simultaneously with the radio-frequency pulse 16 in the slice selection direction $G_S$. The radio-frequency pulses 16 are configured as VERSE pulses. The profile of the slice-selection gradients 17 is configured accordingly. For purposes of comparison, a trapezoidal gradient pulse 18 is shown as a dotted line for a radio-frequency pulse with a sinc profile that selects the same slice. It can be seen that VERSE pulses require stronger but therefore shorter gradient pulses. The change in gradient strength is also very much greater when the gradient pulse 17 is switched than is the case with the gradient pulse 18. In order to compensate the dephasing effect of the slice-selection gradient pulse 17 on the magnetization in the transverse plane, the slice-selection gradient pulse 17 is followed directly by a slice-rephasing gradient pulse 19.

The radio-frequency pulses of two successive sequence blocks may have alternating RF phases a and −a.

A phase-encoding gradient pulse 20 is used in the phase-encoding direction $G_P$. This is provided with varying strengths from sequence block to sequence block (e.g., in each of the $n_{pe}$ repetitions) in order to generate spatial encoding in the phase-encoding direction $G_P$. This is indicated by the arrow 21.

The read-dephasing gradient pulse 22 and the read-gradient pulse 23 are applied in the direction $G_R$. Simultaneously with the read-gradient pulse 23, an acquisition window 24 is open in order to record the generated echo signal 25.

In addition to these gradient pulses, which are present for imaging in all magnetic resonance sequences in which Cartesian k-space sampling is performed, a slice-dephasing gradient pulse 26 and a further slice-selection gradient pulse 17 is present in the slice selection direction $G_S$. The slice-selection gradient pulse 17 is assigned to the next radio-frequency pulse 16 of the next sequence block. These provide that the bSSFP-scanning sequence 11 is "balanced" in the slice selection direction $G_S$ over a repetition time $T_R$. This provides that the sums of the gradient moments in the slice selection direction $G_S$ are equal to zero over a repetition time $T_R$.

A phase-rewind gradient pulse 27 and a read-rewind gradient pulse 28 are also present for the same purpose. An arrow 29 with the reverse direction to that of the arrow 21 is arranged in the phase-rewind gradient pulse 27. This shows the opposite polarity of the phase-encoding gradient pulse 20 compared to the phase-rewind gradient pulse 27 with the same strength in each case.

Thus, the gradient pulses in the read direction $G_R$ and slice selection direction $G_S$ are arranged symmetrically with respect to the point in time 30; the phase-encoding gradient pulse 20 and the phase-rewind gradient pulse 27 are arranged antisymmetrically. The gradient pulses are thus arranged symmetrically in terms of time with respect to the point in time 30.

A sequence block extends from one radio-frequency pulse to the next and has the length TR. The excitation section includes the excitation pulse 16 and the slice-selection gradient pulse 17. The detection section includes the read-gradient pulse 23. While this is applied, an acquisition window is also open.

The bSSFP scanning sequence 12 is only shown as an example of a scan sequence in which a VERSE pulse is used.

Figure 3:
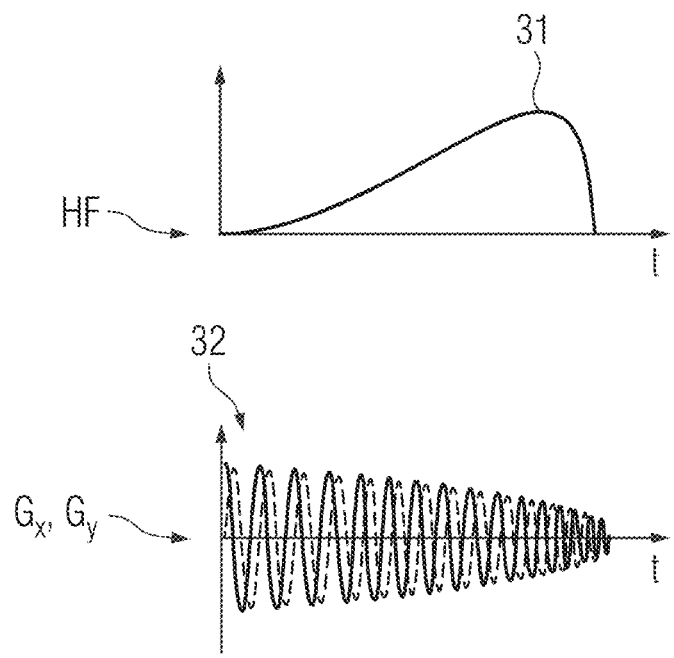
FIG. 3 shows one example of a two-dimensional radio-frequency pulse according to ee-classes.usc.edu/ee591/library/Pauly-RF.pdf.
Figure 4:
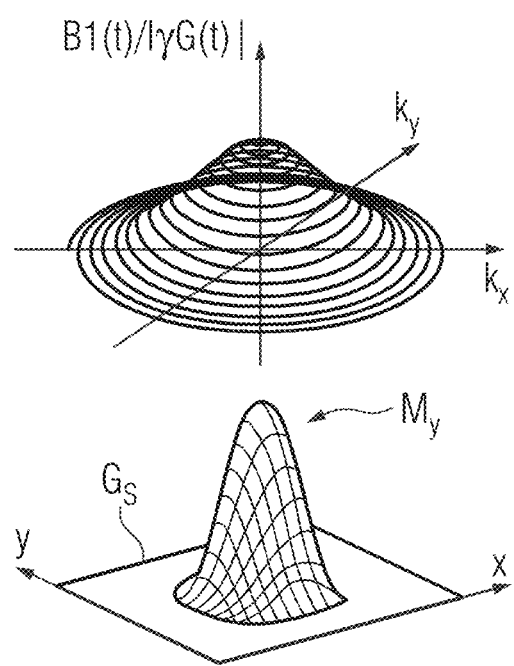
FIG. 4 shows exemplary k-space weighting and the spatial excitation profile of the two-dimensional pulse in FIG. 3.

FIG. 3 shows a multi-dimensional radio-frequency pulse in the form of a two-dimensional radio-frequency pulse 31 (e.g., 2D spatial pulse) together with an associated slice-selection gradient pulse 32. The slice-selection gradient pulse 32 uses gradients in two directions, Gx and Gy, where Gy is 90° out of phase with Gx in order to obtain a spiral k-space trajectory. This is depicted at the top of FIG. 4. Hence, an approximately cuboidal volume may be selected with the 2D spatial pulse 31, where the excitation profile of the pulse 31, 32 in the x and y directions is depicted at the bottom of FIG. 4. Therefore, the selection takes place in two spatial dimensions. Herein, the slice-selection gradient pulse 32 is configured as oscillating. With this shape of a slice-selection gradient pulse, k-space may be traversed during the application of the radio-frequency pulse 31, and thus, the two-dimensional selection may be achieved.

Figure 5:
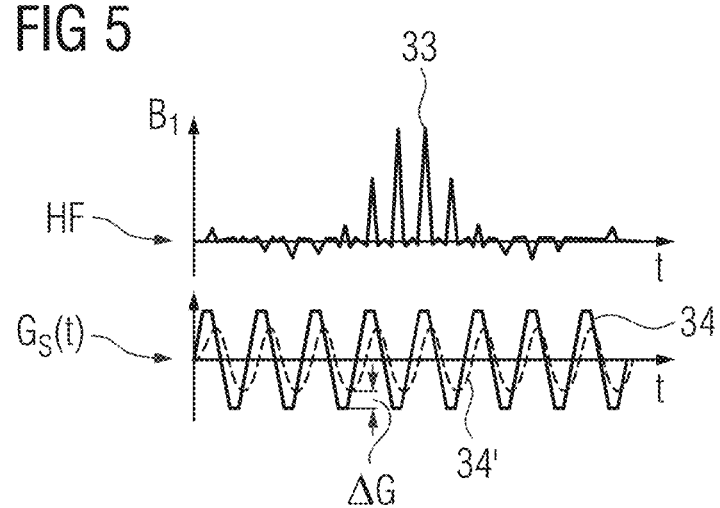
FIG. 5 shows an example of a spectral-spatial selective RF pulse, according to ee-classes.usc.edu/ee591/library/Pauly-RF.pdf.

FIG. 5 shows a multi-dimensional radio-frequency pulse in the form of a spectral-spatial-selective radio-frequency pulse 33 together with an associated slice-selection gradient pulse 34. The RF pulse 33 consists of many contiguous sub-pulses, while the slice-selection gradient pulse 34 is configured as oscillating in a sawtooth-like manner (e.g., switches rapidly back and forth from positive to negative gradients). Herein, a short plateau is maintained at the positive and negative maximum in each case during which an RF sub-pulse is played-in. The spatial profile of the pulse is defined by the shape of the single sub-pulses, and the spectral profile is defined by the envelope curve of the sub-pulse amplitudes. In this way, a spectral component and a slice are selected simultaneously.

The setpoint gradient field 34 is depicted as a solid line in FIG. 5. However, without the correction according to the present embodiments, the gradient field 34' shown as dotted lines would be played out; this has less precisely defined corners and also lags slightly behind the setpoint gradient field 34. Therefore, without the correction terms according to the present embodiments, the gradient pulse 34' would not be optimally matched to the RF pulse 33, and artifacts would occur. The at least one correction term determined by the gradient characteristic enables the difference between the setpoint gradient field 34 and the actual gradient field 34' to be compensated by a compensation field ΔG or the corrected gradient pulse 34 to be output immediately instead of the gradient pulse 34'.

Figure 6:
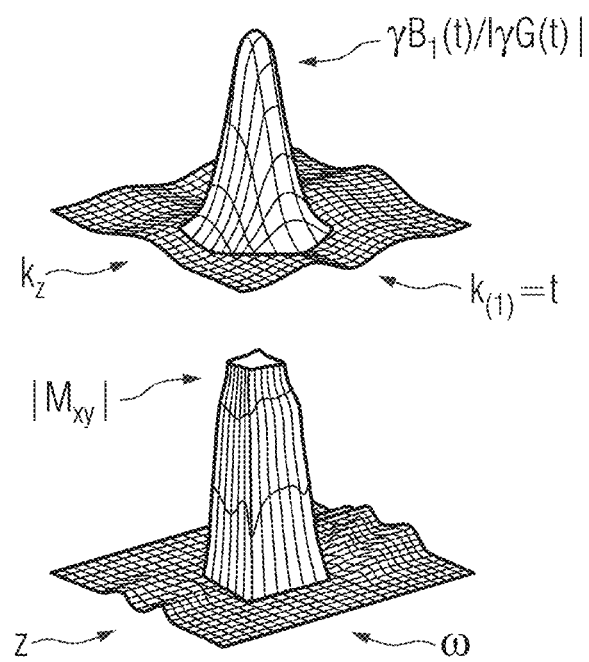
FIG. 6 shows the k-space weighting and the spin-echo profile of the pulse in FIG. 5.

FIG. 6 further shows the k-space weighting and the spin-echo profile of the spectral-spatial pulse in FIG. 5 for purposes of illustration.

Herein, the slice-selection gradient pulses 17, 32, and 34 are in each case corrected according to the present embodiments.

The radio-frequency pulses 31 or 33 may, in each case with slice-selection gradients 32 or 34, respectively, be used in any scanning sequence in order to enable a different selection instead of a slice.

It is common to all slice-selection gradients 17, 32, and 34 that the slice-selection gradients 17, 32, and 34 are non-constant.

Figure 7:
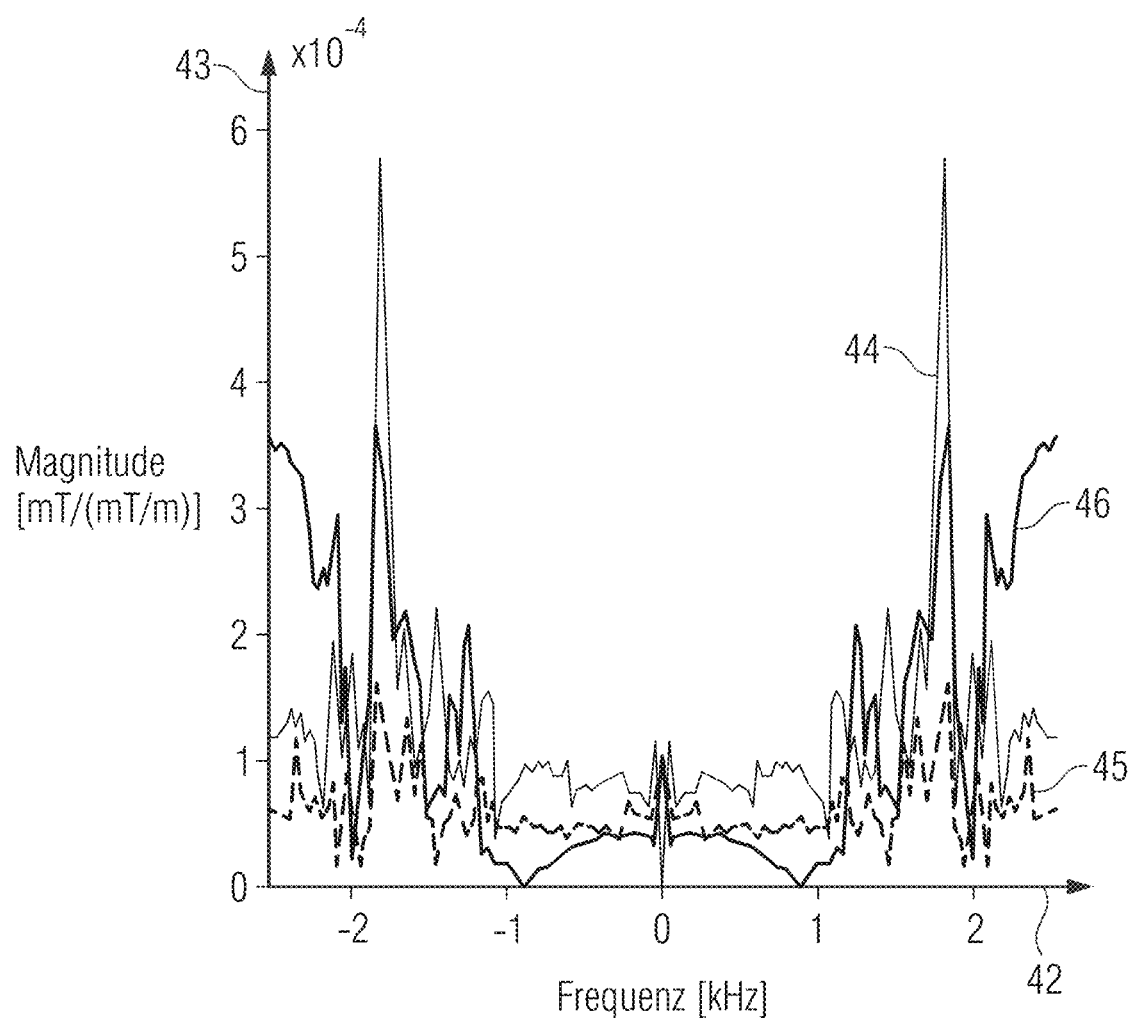
FIG. 7 shows an example of a transfer function for the zero order.

The transfer function GSTF used to ascertain the magnetic field change to be corrected with respective components $GSTF_x$, $GSTF_y$, and $GSTF_z$ (e.g., the cross-terms for the zero order) is depicted with a corresponding magnitude component in FIG. 7. The frequency in kHz is plotted on the axis 42, and a standardized magnitude value is plotted on the axis 43. Line 44 shows the component in the x direction; line 45 shows the component in the y direction, and line 46 shows the component in the z direction. The components may be measured, for example, using the field camera method.

The formula presented above $$\Delta B_{k,l=0}(t) = \mathcal{F}^{-1}(\mathcal{F}\{G\text{nom},k(t)\}\cdot GSTF k,l(f)).$$

may be used to ascertain a change to the magnetic field $DB_{0,x}$, $DB_{0,y}$, and $DB_{0,z}$ from the transfer function GSTF or corresponding components $GSTF_x$, $GSTF_y$, and $GSTF_z$ in each case. This results in a phase change Df.

Figure 8:
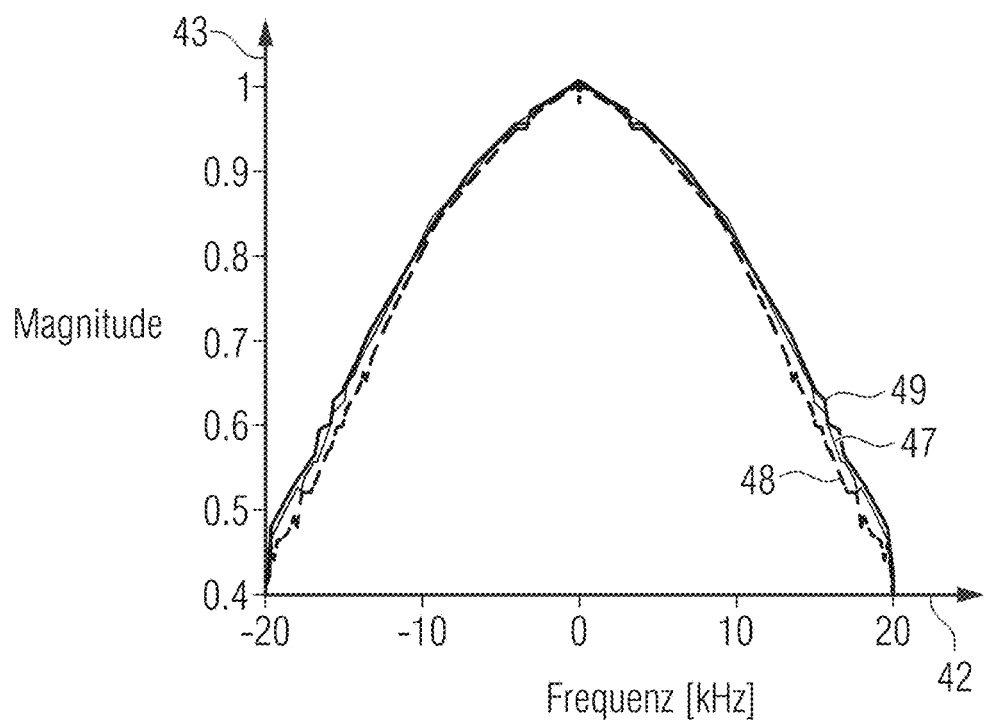
FIG. 8 shows exemplary magnitude values of a transfer function for the 1st order (self-terms)

FIG. 8 shows the magnitude component of the components $GSTF_{xx}$, $GSTF_{yy}$, and $GSTF_{zz}$ of the transfer function GSTF, and thus the 1st order self-terms. Once again, the frequency in kHz is plotted on the axis 42, and a standardized magnitude value is plotted on the axis 43. Herein, it may be seen that the gradient system is configured as a low-pass filter: while low frequencies are transmitted almost in a ratio of 1:1, the proportion decreases sharply toward higher frequencies.

Line 47 shows the component $GSTF_{xx}$, line 48 shows the component $GSTF_{yy}$, and line 49 shows the component $GSTF_{zz}$. These components may again be measured using the field camera method.

Figure 9:
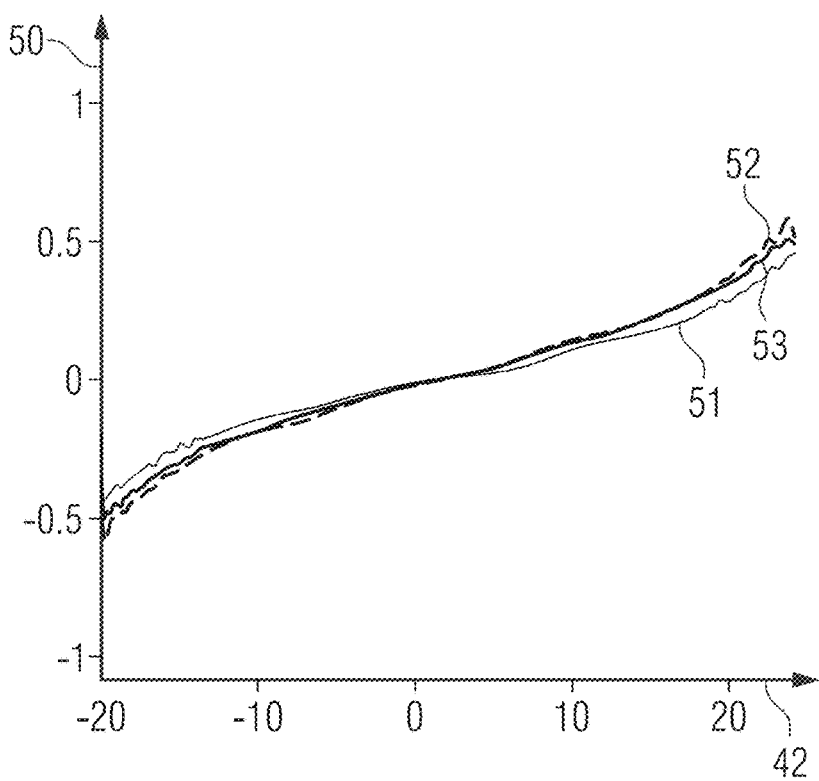
FIG. 9 shows exemplary phase values of a transfer function for the 1st order (self-terms)

FIG. 9 shows the phase component of the components $GSTF_{xx}$, $GSTF_{yy}$, and $GSTF_{zz}$ of the transfer function GSTF and thus of the 1st order. Once again, the frequency in kHz is plotted on the axis 42, and a standardized phase value is plotted on the axis 50.

Line 51 shows the phase values of the component $GSTF_{xx}$, line 52 shows the phase values of the component $GSTF_{yy}$, and line 53 shows the phase values of the component $GSTF_{zz}$. These components may again be measured using the field camera method.

The components shown in FIGS. 8 and 9 may be used to correct the GIRF-based artifacts of the gradient pulses or gradient axes with respect to one another. The zero order according to FIG. 7 may be used to ascertain the phase deviation.

Figure 10:
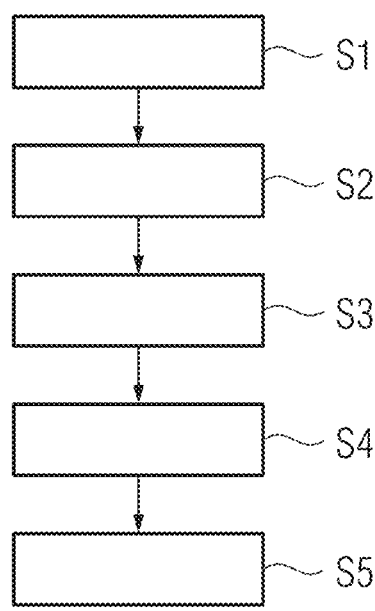
FIG. 10 shows a first flow chart for recording a magnetic resonance data set.

FIG. 10 shows a first flow chart for recording a magnetic resonance image data set.

In act S1, the pre-distortion filter p is provided. The pre-distortion filter was ascertained using a transfer function GSTF or, to be more precise, at least the 1st order of the components $GSTF_{xx}$, $GSTF_{yy}$, and $GSTF_{zz}$.

In act S2, a magnetic resonance sequence (e.g., a magnetic resonance sequence including a two-dimensional slice-selection pulse 12 or a spectral-spatial selective pulse 13) is provided.

Usually, after a magnetic resonance sequence has been loaded, parameters such as the position of the slice or slices, the resolution, the number of image elements, etc. are set in act S3. Only then is the exact configuration of the gradients fixed.

The sequence of gradients or gradient pulses resulting from this magnetic resonance sequence 12 may either be used as a whole in order to calculate pre-distorted gradients $G_{pre}$ taking into account all effects using the pre-distortion filter p in act S4. Herein, pre-distorted gradient strengths that generate additional compensation fields when played out are ascertained. The effects taken into account are at least the self-terms and, for example, the 1st order cross-terms. Then, in act S5, a magnetic resonance image data set is recorded with the magnetic resonance sequence. This may be a 2D image data set with one or more slices, a 3D image data set, or even a 4D image data set.

Figure 11:
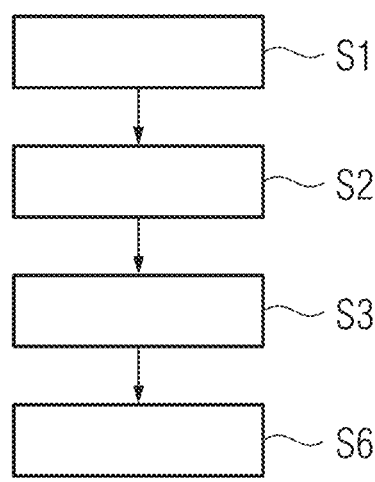
FIG. 11 shows a second flow chart for recording a magnetic resonance data set.

FIG. 11 shows a second embodiment of a flow chart for recording a magnetic resonance data set. After acts S1 to S3, the provision of the transfer function and the magnetic resonance sequence and the setting of the parameters of the magnetic resonance sequence, this has the act S6. In this act, the gradient pulses are collectively sent in sections (e.g., for a repetition time $T_R$) as a digital gradient sequence signal to a control facility, a pre-distortion filter p is applied thereto, and a resultant signal is transmitted as a pre-distorted gradient signal $G_{pre1}$ to the magnetic resonance system.

Herein, the pre-distortion filter p is simple to implement since, as described above, nominal gradient pulses $G_{nom}$ are converted into pre-distorted gradient pulses $G_{pre}$ from short sections.

Repeated calculation is necessary since at least the phase-encoding gradient pulse 20 and then also the phase-rewind gradient pulse 27 have different values in different sequence blocks. This embodiment may, for example, be used in the case of sampling with continuous sequence blocks.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for recording a magnetic resonance image data set with a magnetic resonance system having a gradient system, the method comprising:
providing a magnetic resonance sequence for performing a magnetic resonance scan, wherein the magnetic resonance sequence has at least one radio-frequency pulse and a slice-selection gradient pulse applied during or before the at least one radio-frequency pulse, wherein, at least for a predetermined time interval, the slice-selection gradient pulse is configured as non-constant during the application of the at least one radio-frequency pulse;
providing at least one correction term for compensating a magnetic field change, wherein the magnetic field change is obtained as a change to an actual magnetic field compared to a setpoint magnetic field due to the slice-selection gradient pulse, wherein the magnetic field change is ascertained via a transfer characteristic of the gradient system of the magnetic resonance system, and the transfer characteristic represents the system characteristic of the gradient system in amplitude, phase, or amplitude and phase of different frequencies;
recording at least one magnetic resonance image data set with the magnetic resonance sequence using the at least one correction term; and
generating a corrected slice-selection gradient pulse using the at least one correction term.

2. In a non-transitory computer-readable storage medium that stores instructions executable by one or more processors to record a magnetic resonance image data set with a magnetic resonance system having a gradient system, the instructions comprising:
providing a magnetic resonance sequence for performing a magnetic resonance scan, wherein the magnetic resonance sequence has at least one radio-frequency pulse and a slice-selection gradient pulse applied during or before the at least one radio-frequency pulse, wherein, at least for a predetermined time interval, the slice-selection gradient pulse is configured as non-constant during the application of the at least one radio-frequency pulse, wherein at least one gradient pulse of the magnetic resonance sequence leads to a magnetic field change to a basic magnetic field;
providing at least one correction term for compensating a magnetic field change, wherein the magnetic field change is obtained as a change to an actual magnetic field compared to a setpoint magnetic field due to the slice-selection gradient pulse, wherein the magnetic field change is ascertained via a transfer characteristic of the gradient system of the magnetic resonance system, and the transfer characteristic represents the system characteristic of the gradient system in amplitude, phase, or amplitude and phase of different frequencies;
recording at least one magnetic resonance image data set with the magnetic resonance sequence using the at least one correction term; and
ascertaining a correction term for generating a compensation phase or a component of the compensation field, wherein the magnetic field change of the basic magnetic field is calculated as:

$$\Delta B_{k,l=0}(t) = \mathcal{F}^{-1}(\mathcal{F}\{G\text{nom},k(t)\} \cdot \text{GSTF}k,l(f)\}), \text{ and}$$

wherein l denotes the zero order of a transfer function of the gradient system of the magnetic resonance system, k denotes one of the gradient axes, $\mathcal{F}$ is a Fourier transform, and $G_{nom,k}$ denotes the gradient pulse or pulses applied to the gradient axis.

3. A magnetic resonance system comprising:
a gradient system; and
a control facility configured to record a magnetic resonance image data set with a magnetic resonance system having a gradient system, the recordation of the magnetic resonance image data set comprising:
provision of a magnetic resonance sequence for performing a magnetic resonance scan, wherein the magnetic resonance sequence has at least one radio-frequency pulse and a slice-selection gradient pulse applied during or before the at least one radio-frequency pulse, wherein, at least for a predetermined time interval, the slice-selection gradient pulse is configured as non-constant during the application of the at least one radio-frequency pulse;

provision of at least one correction term for compensating a magnetic field change, wherein the magnetic field change is obtained as a change to an actual magnetic field compared to a setpoint magnetic field due to the slice-selection gradient pulse, wherein the magnetic field change is ascertained via a transfer characteristic of the gradient system of the magnetic resonance system, and the transfer characteristic represents the system characteristic of the gradient system in amplitude, phase, or amplitude and phase of different frequencies;

recordation of at least one magnetic resonance image data set with the magnetic resonance sequence using the at least one correction term; and generation of a corrected slice-selection gradient pulse using the at least one correction term.

4. The method of claim 1, wherein the at least one correction term contains a current feed rating for gradient coils with which the corrected slice-selection gradient pulse is generated.

5. The method of claim 1, wherein the transfer characteristic has orders, and the magnetic field change is ascertained from at least one $1^{st}$ order component.

6. The method of claim 1, wherein a transfer function is used as the transfer characteristic.

7. The method of claim 1, wherein the slice-selection gradient pulse is configured as at least temporarily non-constant during the application of the at least one radio-frequency pulse.

8. The method of claim 1, wherein the corrected slice-selection gradient pulse is generated via a pre-distortion filter for the gradient system of the magnetic resonance system.

9. The method of claim 1, wherein at least one gradient pulse of the magnetic resonance sequence leads to a magnetic field change to a basic magnetic field, and wherein the method further comprises ascertaining a correction term for generating a compensation phase or a component of the compensation field.

10. The method of claim 9, wherein the magnetic field change of the basic magnetic field is calculated as:

$$\Delta B_{k,l=0}(t) = \mathcal{F}^{-1}(\mathcal{F}\{G\text{nom},k(t)\} \cdot \text{GSTF}k,l(f)), \text{ and}$$

wherein l denotes the zero order of a transfer function of the gradient system of the magnetic resonance system, k denotes one of the gradient axes, $\mathcal{F}$ is a Fourier transform, and $G_{nom,k}$ denotes the gradient pulse or pulses applied to the gradient axis.

11. The method of claim 9, wherein a phase deviation Df resulting from the magnetic field change is calculated as:

$$Df = \int g \cdot DB \, dt,$$

wherein DB is the magnetic field change, g is the gyromagnetic ratio, and ($\int dt$) is an integral over the time, and wherein a reference phase of the magnetic resonance system is adjusted by this value at predetermined points in time.

12. The method of claim 1, wherein the magnetic resonance system has a pre-distortion filter for the gradient system, and the pre-distortion filter is used to compensate deviations of all gradient pulses of the magnetic resonance sequence characterized by a Fourier transform.

13. The non-transitory computer-readable storage medium of claim 2, wherein the instructions further comprise generating a corrected slice-selection gradient pulse using the at least one correction term.

14. The non-transitory computer-readable storage medium of claim 13, wherein the at least one correction term contains a current feed rating for gradient coils with which the corrected slice-selection gradient pulse is generated.

15. The non-transitory computer-readable storage medium of claim 2, wherein the transfer characteristic has orders, and the magnetic field change is ascertained from at least one $1^{st}$ order component.

16. The non-transitory computer-readable storage medium of claim 2, wherein a transfer function is used as the transfer characteristic.

17. The non-transitory computer-readable storage medium of claim 2, wherein the slice-selection gradient pulse is configured as at least temporarily non-constant during the application of the at least one radio-frequency pulse.

* * * * *